US009837162B2

(12) United States Patent
Kawae et al.

(10) Patent No.: US 9,837,162 B2
(45) Date of Patent: Dec. 5, 2017

(54) SEMICONDUCTOR DEVICE AND SEMICONDUCTOR INTEGRATED CIRCUIT

(71) Applicant: Renesas Electronics Corporation, Tokyo (JP)

(72) Inventors: Masayuki Kawae, Tokyo (JP); Takafumi Noguchi, Tokyo (JP); Atsuo Yoneyama, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/363,125

(22) Filed: Nov. 29, 2016

(65) Prior Publication Data

US 2017/0178735 A1 Jun. 22, 2017

(30) Foreign Application Priority Data

Dec. 18, 2015 (JP) ................. 2015-247356

(51) Int. Cl.
*G11C 11/24* (2006.01)
*G11C 16/30* (2006.01)
*G11C 16/34* (2006.01)

(52) U.S. Cl.
CPC .......... *G11C 16/30* (2013.01); *G11C 16/3418* (2013.01); *G11C 16/3427* (2013.01)

(58) Field of Classification Search
CPC .................... G11C 16/30; G11C 16/3427
USPC ............................................ 365/185.18
See application file for complete search history.

(56) References Cited

U.S. PATENT DOCUMENTS

| 5,144,525 A * | 9/1992 | Saxe .................. G11C 27/04 365/194 |
| 7,171,601 B2 * | 1/2007 | Frisch .............. G01R 31/31709 714/724 |
| 2015/0092470 A1 * | 4/2015 | Vimercati ............ G11C 13/004 365/148 |

FOREIGN PATENT DOCUMENTS

JP          2001-319488 A      11/2001

* cited by examiner

*Primary Examiner* — Richard Elms
*Assistant Examiner* — Xiaochun L Chen
(74) *Attorney, Agent, or Firm* — Sughrue Mion, PLLC

(57) ABSTRACT

A semiconductor device that can rapidly stabilize a control voltage for controlling an electric current source is provided. A semiconductor device includes a filter circuit that is provided between a control voltage generation circuit and an electric current source and removes noise of the control voltage. The filter circuit includes a first resistive element that is provided between the control voltage generation circuit and an output node that outputs the control voltage, a first capacitive element that is provided between the output node and a first voltage, a second capacitive element that is coupled between the output node and the first voltage via a first switch element. The second capacitive element is coupled between the first voltage and a second voltage when the first switch element is non-conductive. The second capacitive element is coupled with the first capacitive element through the output node when the first switch element is conductive.

10 Claims, 9 Drawing Sheets

SEMICONDUCTOR DEVICE AND SEMICONDUCTOR INTEGRATED CIRCUIT

CROSS-REFERENCE TO RELATED APPLICATIONS

The disclosure of Japanese Patent Application No. 2015-247356 filed on Dec. 18, 2015 including the specification, drawings and abstract is incorporated herein by reference in its entirety

BACKGROUND

The present disclosure relates to a semiconductor device and a semiconductor integrated circuit which have a filter circuit.

In related art, regarding a semiconductor integrated circuit, low power consumption and high-speed performance are strongly required for general-purpose memory such as flash memory.

In general, a flash memory and the like are provided with various modes to satisfy the low power consumption requirement. For example, a method is employed in which a low power consumption mode is provided and a power supply circuit is stopped.

Further, to satisfy the high-speed performance, for example, it is required to rapidly stabilize voltage outputted from a power supply circuit included in a flash memory.

In this respect, Japanese Unexamined Patent Application Publication No. 2001-319488 proposes a method that stabilizes a bias voltage outputted from a bias circuit to secure high-speed performance of a read system circuit.

SUMMARY

On the other hand, it is known that feedback noise from the entire semiconductor integrated circuit occurs in the bias voltage outputted from the bias circuit, and as a countermeasure against this, a configuration is employed in which a filter circuit that removes noise is provided to a power supply circuit such as a bias circuit.

However, there is a problem that it takes time for a voltage level outputted from the power supply circuit to stabilize to a desired voltage level by being affected by a capacitive component of the filter circuit.

Other objects and novel features will become apparent from the description of the present specification and the accompanying drawings.

According to an embodiment, a semiconductor device includes an electric current source, a control voltage generation circuit that outputs a control voltage for controlling the electric current source, and a filter circuit that is provided between the control voltage generation circuit and the electric current source and removes noise of the control voltage. The filter circuit includes a first resistive element that is provided between the control voltage generation circuit and an output node that outputs the control voltage, a first capacitive element that is provided between the output node and a first voltage, a second capacitive element that is coupled between the output node and the first voltage in parallel with the first capacitive element, and a first switch element that is provided between the second capacitive element and the output node. The second capacitive element is coupled between the first voltage and a second voltage when the first switch element is non-conductive. The second capacitive element is coupled with the first capacitive element through the output node when the first switch element is conductive.

According to an embodiment, it is possible to rapidly stabilize a control voltage for controlling an electric current source.

DETAILED DESCRIPTION

Figure 1:
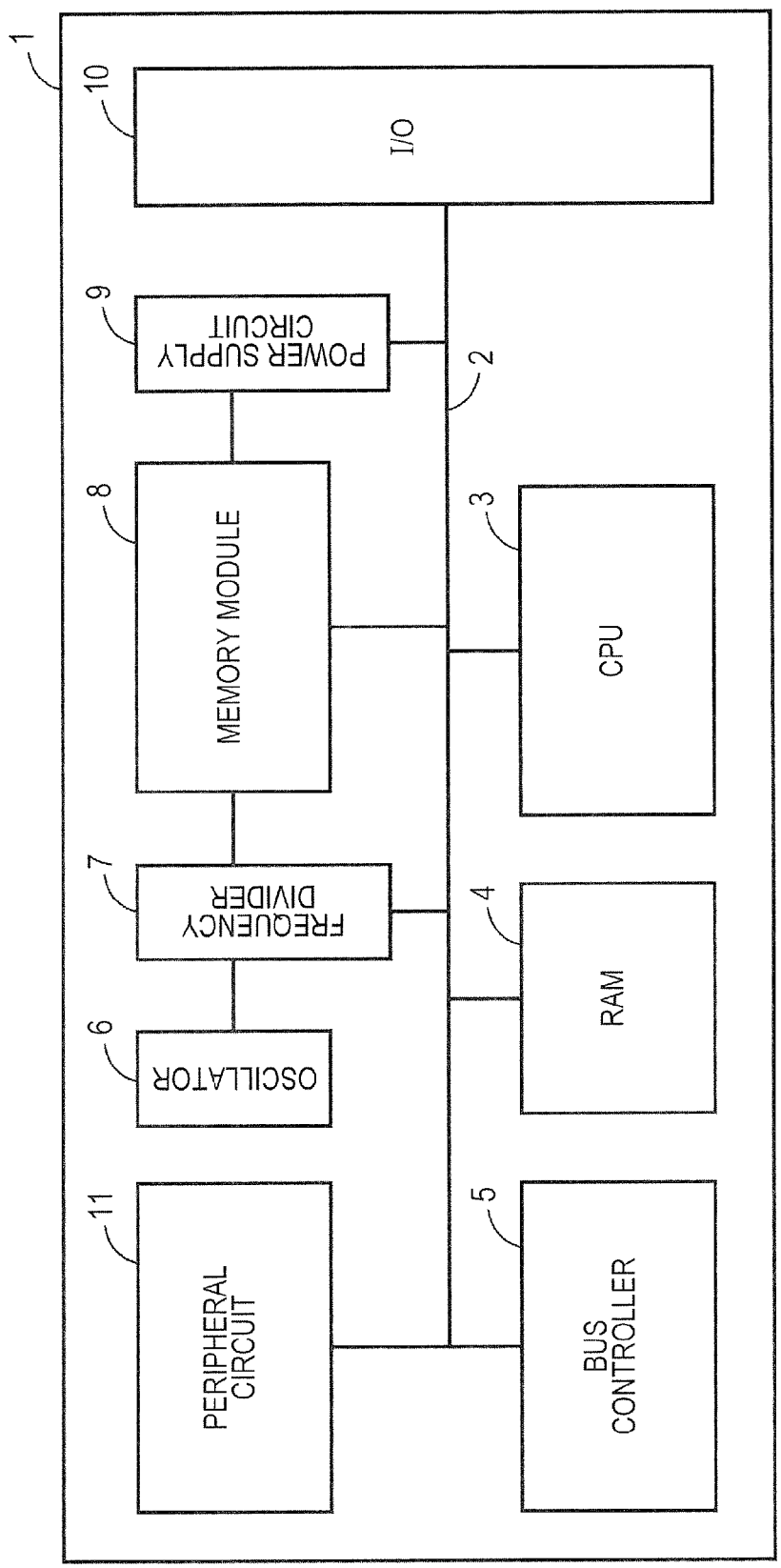
FIG. 1 is a schematic diagram of an entire configuration of a semiconductor integrated circuit based on an embodiment.

An embodiment will be described in detail with reference to the drawings. In the drawings, the same or corresponding components are denoted by the same reference numerals and the description thereof will not be repeated.

A. Entire Configuration

FIG. 1 is a schematic diagram of an entire configuration of a semiconductor integrated circuit based on an embodiment.

As shown in FIG. 1, in the present example, a single-chip microcomputer, also referred to as a data processor or a microprocessor, will be described as an example of a semiconductor integrated circuit 1. Although not particularly limited, the microcomputer is formed on one semiconductor substrate (chip) such as a single-crystal silicon by a known semiconductor integrated circuit manufacturing technique.

The semiconductor integrated circuit 1 includes a memory module having a flash memory.

The semiconductor integrated circuit 1 includes an internal bus 2, a CPU (Central Processing Unit) 3, a RAM (Random Access Memory) 4, a bus controller 5, an oscillator 6, a frequency dividing circuit 7, a memory module 8, a power supply circuit 9, an input/output port (I/O) 10, and a peripheral circuit 11.

The peripheral circuit 11 includes an AD converter and a timer counter.

The internal bus 2 includes an address bus, a data bus, and a control bus.

Circuit modules are coupled to each other through the internal bus 2 and data transmission/reception is performed.

The CPU 3 controls the entire semiconductor integrated circuit 1. The CPU 3 includes an instruction control unit and an execution unit. The CPU 3 decodes a fetched instruction and executes arithmetic processing in the execution unit according to a decoding result.

The RAM 4 is used as a work area and the like of the CPU 2.

The bus controller 5 performs arbitration control of the internal bus 2 and controls data transmission/reception using the internal bus 2. Specifically, the bus controller 5 responds to an access request from the CPU 3 and performs arbitration control of the number of access cycles, the number of wait states, a bus width, and the like according to a target address of the access.

The oscillator 6 generates a clock signal. The oscillator 6 is coupled with the frequency dividing circuit 7 and generates and outputs an operation reference clock signal for controlling various circuits and other internal clock signals by dividing the frequency of the clock signal.

The memory module 8 has a flash memory as an example and stores an operation program of the CPU 3, data, or the like.

The power supply circuit 9 generates voltages of various circuit modules.

The CPU 3 performs erase and write control on the memory module 8.

In a device test stage or a manufacturing stage, an external writing device (not shown in the drawings) may directly perform the erase and write control on the memory module 8 through the input/output port 10.

After power-on, the inside of the semiconductor integrated circuit 1 is initialized in a low level period of a reset signal. When reset is released by a high level of the reset signal, the CPU 3 starts execution of a program in a program area specified by a vector in address 0 or the like.

Figure 2:
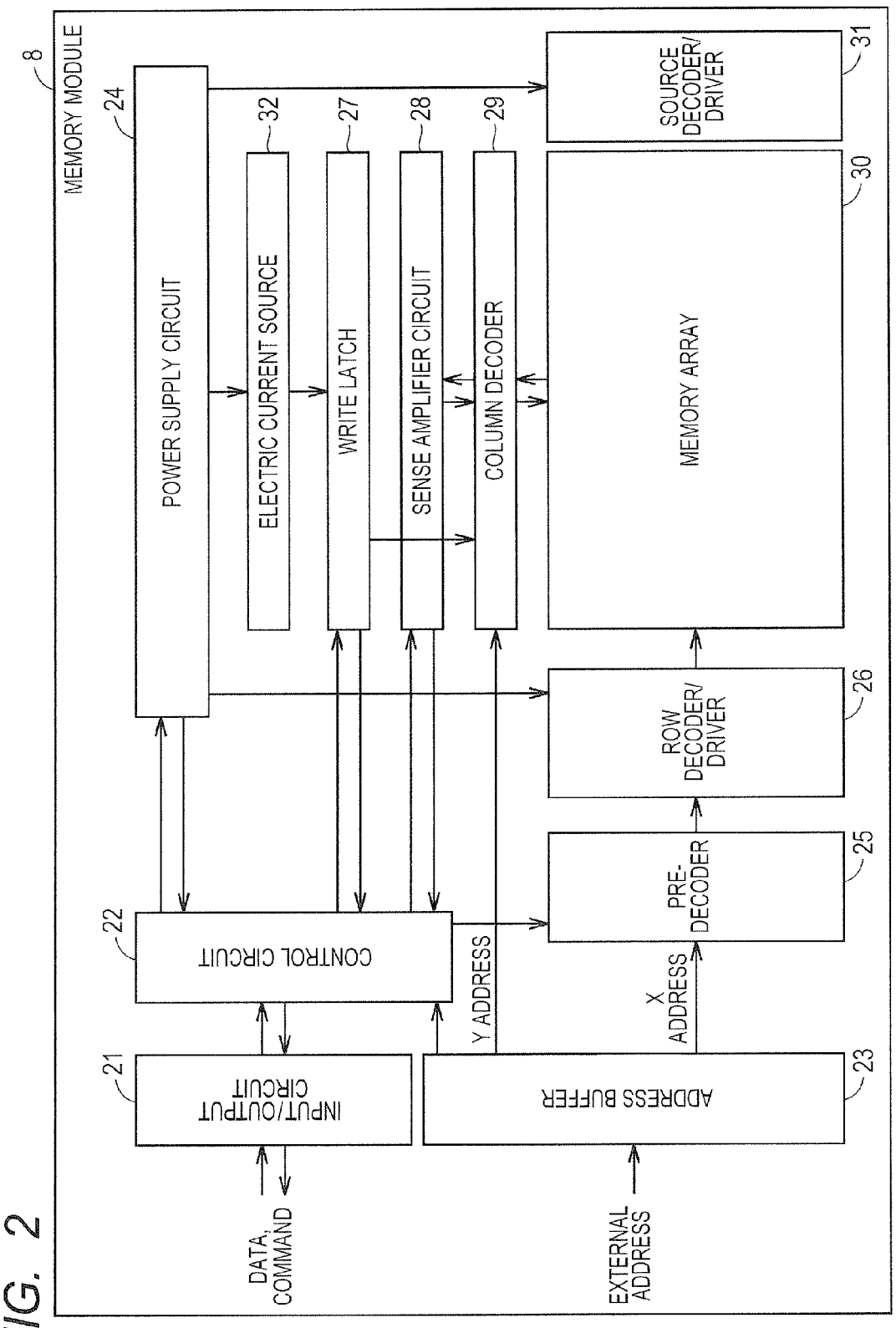
FIG. 2 is a diagram for explaining a configuration of a memory module 8 based on the embodiment.

FIG. 2 is a diagram for explaining a configuration of the memory module 8 based on the embodiment.

As shown in FIG. 2, the memory module 8 includes an input/output circuit 21, a control circuit 22, an address buffer 23, a power supply circuit 24, a pre-decoder 25, a row decoder/driver 26, a write latch 27, a sense amplifier circuit 28, a column decoder 29, a memory array 30, a source decoder/driver 31, and an electric current source 32.

The memory array 30 includes a plurality of flash memories arranged in a matrix form.

The input/output circuit 21 is coupled to the outside internal bus 2 and transmits and receives data and commands.

The control circuit 22 controls each circuit in the memory module 8.

The address buffer 23 is coupled to the outside internal bus 2 and holds an address for accessing the memory array 30.

The power supply circuit 24 supplies a necessary voltage to each circuit in the memory module 8. Specifically, the power supply circuit 24 generates a voltage for writing and erasing and generates a voltage for driving the electric current source 32.

The pre-decoder 25 pre-decodes an address for accessing the memory array 30.

The row decoder/driver 26 decodes a row address X from the address buffer 23 and drives a word line.

The write latch 27 is coupled to the electric current source 32 and holds data to be written to the memory array 30.

The sense amplifier circuit 28 amplifies a signal read from the memory array 30 during data reading and outputs the signal as read data.

The column decoder 29 decodes a column address Y from the address buffer 23 and selects a bit line and the like.

The source decoder/driver 31 drives a source line.

Figure 3:
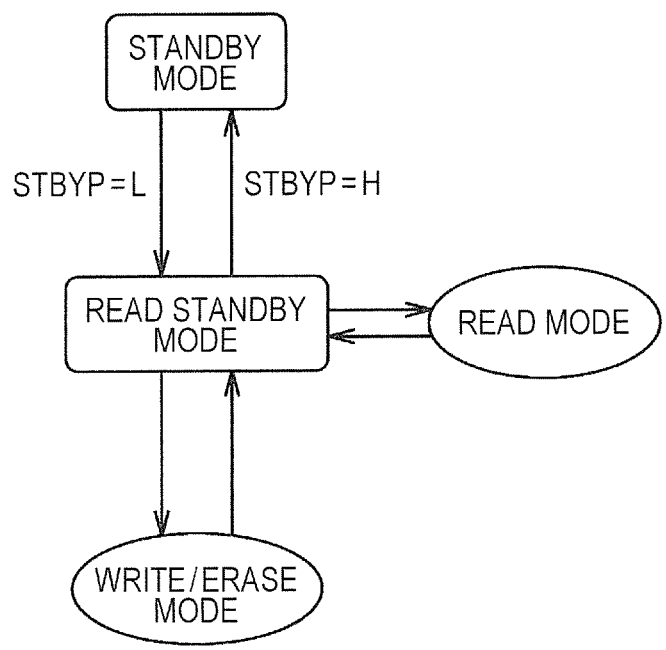
FIG. 3 is a diagram for explaining a transition of mode of the memory module 8 based on the embodiment.

FIG. 3 is a diagram for explaining a transition of mode of the memory module 8 based on the embodiment.

As shown in FIG. 3, here, a case is shown in which a mode transitions from a standby mode to a read standby mode and a mode transitions from the read standby mode to a read mode or a write/erase mode.

The standby mode is a low power consumption mode. In the standby mode, the power supply circuit 24 and the electric current source 32 inside the memory module 8 are set to an inactivated mode. As an example, a return operation from the low power consumption mode is performed according to an input of a standby signal STBYP ("L" level) inputted from the CPU 3. In the present example, the mode transitions from the standby mode to the read standby mode. Accordingly, the power supply circuit 24 and the electric current source 32 inside the memory module 8 are set to an activated mode.

Then, the mode transitions from the read standby mode to the read mode and data reading is performed.

On the other hand, the mode transitions from the read standby mode to the standby mode which is a low power consumption mode according to an input of the standby signal STBYP ("H" level) inputted from the CPU 3.

Figure 4:
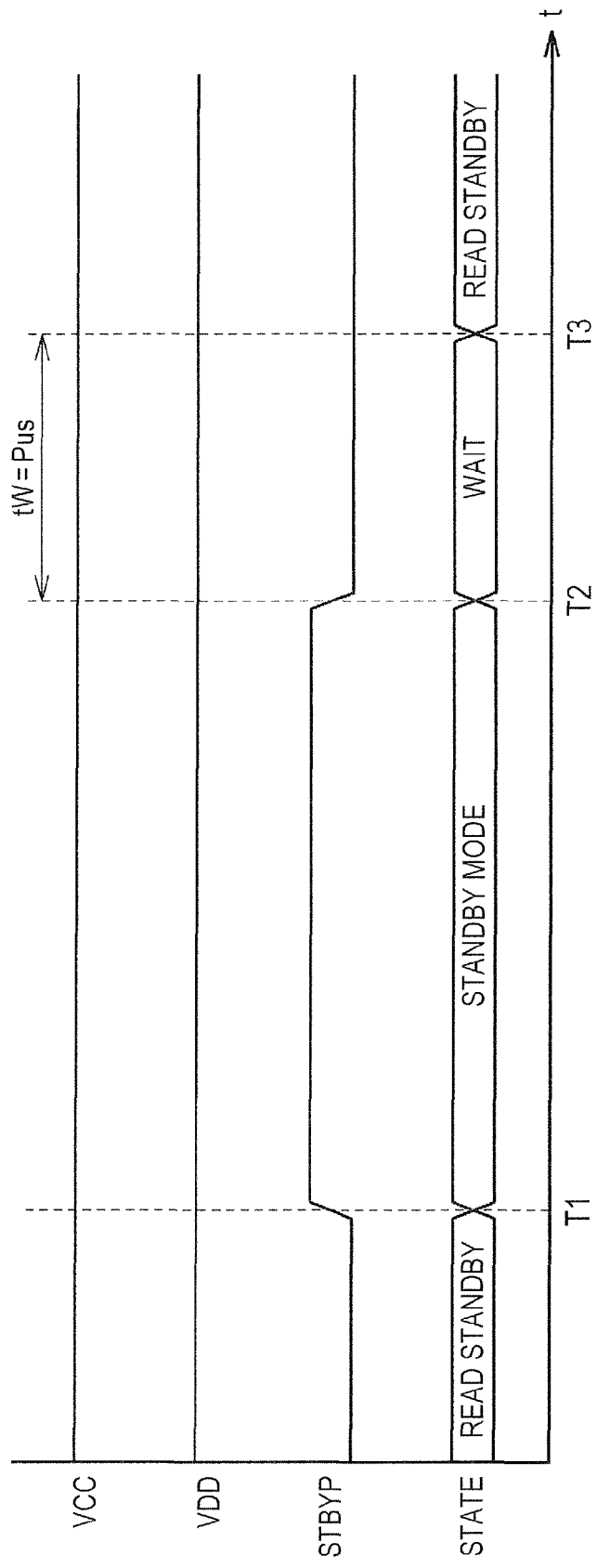
FIG. 4 is a diagram for explaining a transition of standby mode and read standby mode of the memory module 8 based on the embodiment.

FIG. 4 is a diagram for explaining a transition of the standby mode and the read standby mode of the memory module 8 based on the embodiment.

As shown in FIG. 4, a case is shown in which the mode of the memory module 8 transitions according to the standby signal STBYP inputted from the CPU 3. Specifically, a case is shown in which the read standby mode is set when the standby signal STBYP is "L" level. When the standby signal STBYP transitions to "H" level at time T1, the mode transitions from the read standby mode to the standby mode.

Next, when the standby signal STBYP transitions to "L" level at time T2, the mode transitions from the standby mode to the read standby mode.

On the other hand, when the mode transitions from the standby mode to the read standby mode, the power supply circuit 24 and the electric current source 32 inside the memory module 8 are set to the activated mode, so that a predetermined wait state is provided until a voltage from the power supply circuit 24 and a current from the electric current source 32 are stabilized. In the present example, after waiting a wait time tW=Pμs, the mode transitions to the read standby mode at time T3.

Figure 5:
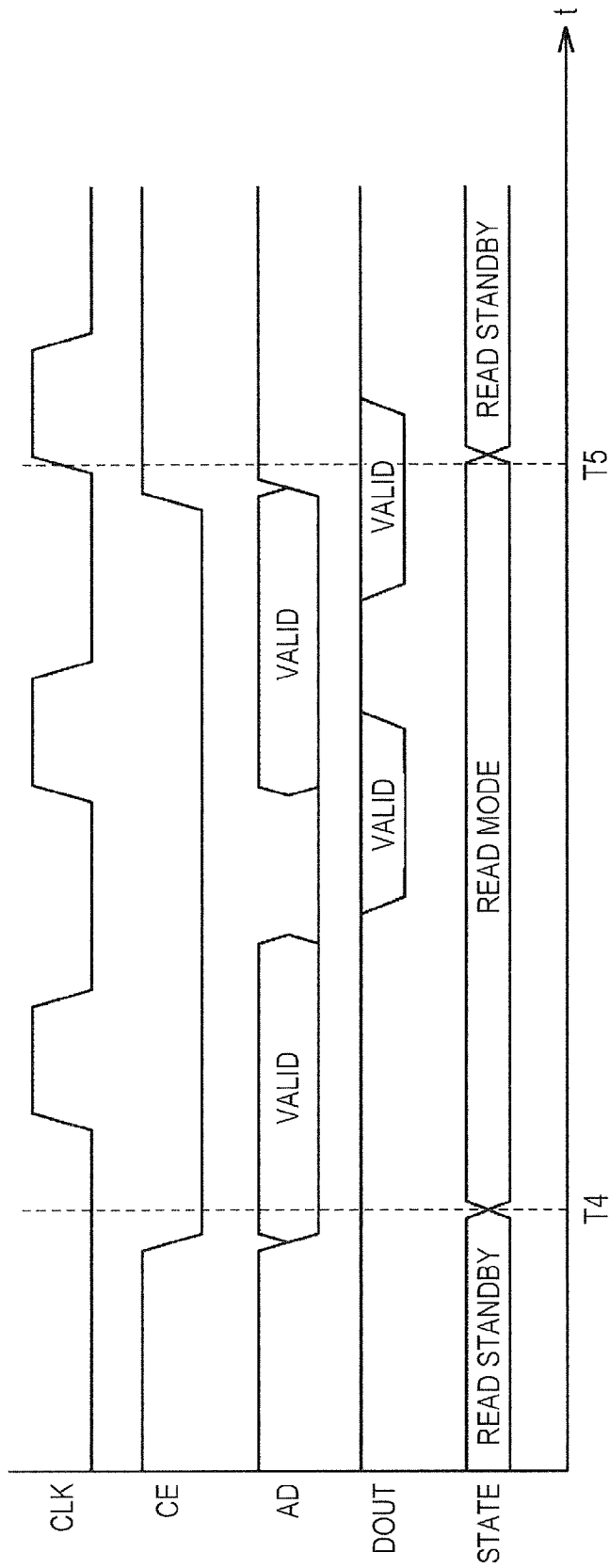
FIG. 5 is a diagram for explaining data reading based on the embodiment.

FIG. 5 is a diagram for explaining data reading based on the embodiment.

As shown in FIG. 5, in the read standby mode, the mode transitions to the read mode according to a chip enable signal CE included in an instruction from the CPU 3 to read data from the memory module 8.

As an example, at time T4, the mode transitions from the read standby mode to the read mode according to "L level" of the chip enable signal CE.

Then, the memory module 8 operates in synchronization with an internal clock signal CLK generated by the frequency dividing circuit 7.

When the internal clock signal CLK rises from "L level" to "H level", an external address signal AD inputted from the outside is latched by the address buffer 23 of the memory module 8.

The latched external address signal AD is outputted to the pre-decoder 25 and the column decoder 29 as an X address and a Y address, respectively. Then, the signal pre-decoded by the pre-decoder 25 is inputted to the row decoder/driver 26. Then, the row decoder/driver 26 performs row selection based on the X address. Further, the column decoder 29 decodes the Y address and performs column selection. Thereby, a specified memory cell in the memory array 30 is accessed and data is read from the memory cell.

Then, read data DOUT that has been read is outputted to the internal bus 2 through the input/output circuit 21.

In the present example, a case is shown in which data is read two times according to an input of the external address signal AD in the read mode.

At time T5, the mode transitions from the read mode to the read standby mode according to "H level" of the chip enable signal CE.

Figure 6:
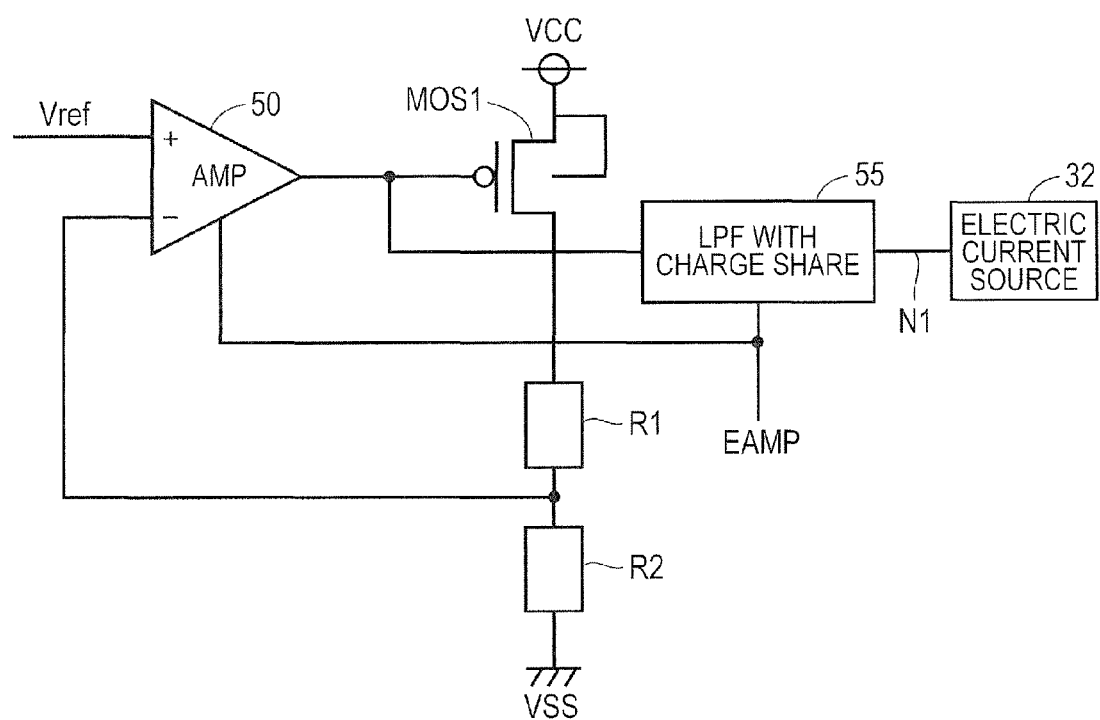
FIG. 6 is a diagram for explaining a part of a configuration of a power supply circuit 24 based on the embodiment.

FIG. 6 is a diagram for explaining a part of a configuration of the power supply circuit 24 based on the embodiment.

As shown in FIG. 6, the power supply circuit 24 includes a control voltage generation circuit and a filter circuit with charge share 55.

The filter circuit with charge share 55 is provided between the control voltage generation circuit and the electric current source 32 and removes noise of a control voltage. In the present example, a low pass filter circuit including a resistive element and a capacitive element is provided. A cutoff frequency of the filter circuit is set based on a resistive component of the resistive element and a capacitive component of the capacitive element.

The filter circuit with charge share 55, which is described later, is provided with a circuit that can share charge. The circuit that can share charge operates according to an activation signal EAMP.

The control voltage generation circuit outputs a control voltage for controlling the electric current source.

The control voltage generation circuit includes an operational amplifier (AMP) 50, a P-channel MOS transistor MOS1, and resistive elements R1 and R2.

The source of the P-channel MOS transistor MOS1 is coupled to a power supply voltage VCC and the drain is coupled to the resistive element R1. The gate of the P-channel MOS transistor MOS1 receives an output signal of the AMP 50.

The AMP 50 is activated according to the activation signal EAMP. In the present example, the AMP 50 is activated according to the activation signal EAMP ("H" level) and the AMP 50 is inactivated according to the activation signal EAMP ("L" level).

In the standby mode, the activation signal EAMP is set to "L" level. In the read standby mode, the activation signal EAMP is set to "H" level.

A coupling node of the resistive elements R1 and R2 is fed back to the AMP 50 and coupled to one of input terminals.

The other input terminal of the AMP 50 receives an input of a reference voltage Vref.

The AMP 50 adjusts a voltage outputted to the P-channel MOS transistor MOS1 so that a voltage of the coupling node of the resistive elements R1 and R2 is the same as the reference voltage Vref.

The filter circuit with charge share 55 is coupled to the output of the AMP 50, removes a noise component of a control voltage outputted from the AMP 50, and then outputs the control voltage to the electric current source 32.

The electric current source 32 receives the control voltage outputted from the AMP 50 and is adjusted so that the same current as that flowing through the resistive elements R1 and R2 flows.

Figure 7:
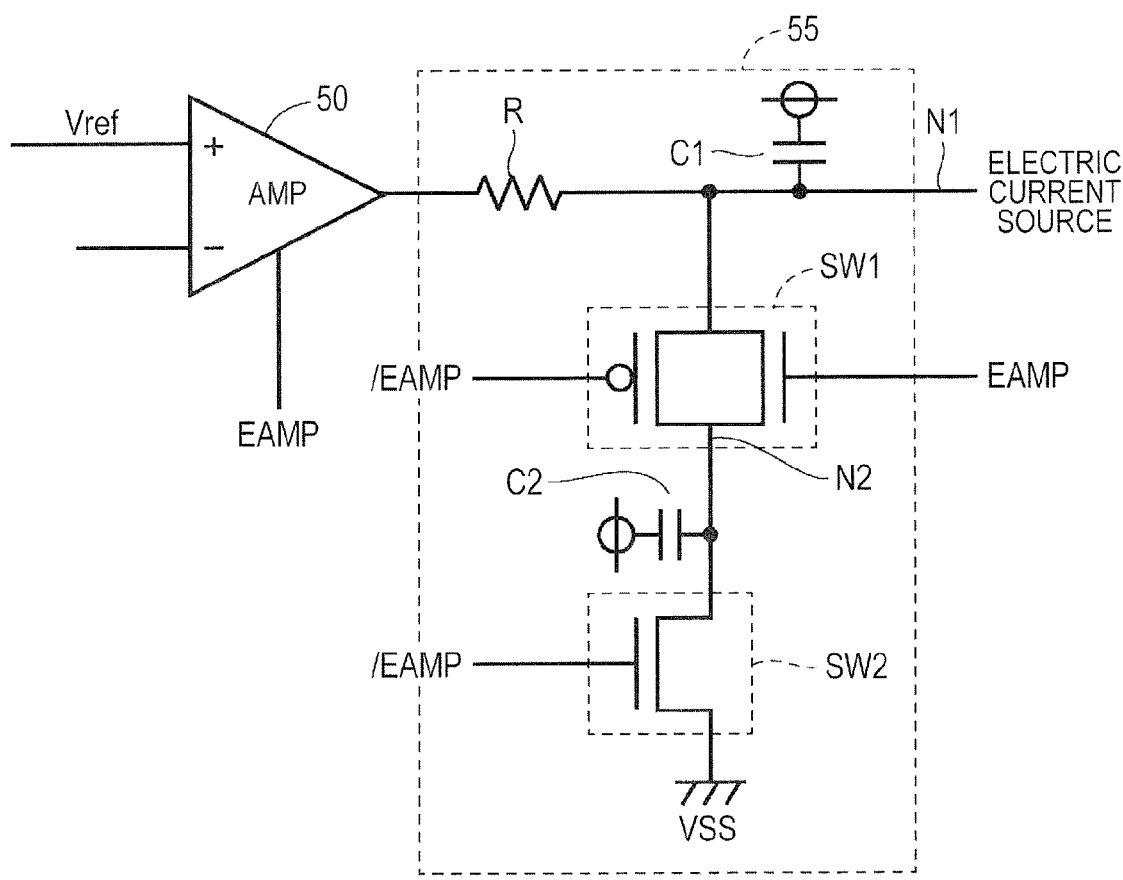
FIG. 7 is a diagram for explaining a configuration of a filter circuit with charge share 55 based on the embodiment.

FIG. 7 is a diagram for explaining a configuration of the filter circuit with charge share 55 based on the embodiment.

As shown in FIG. 7, the filter circuit with charge share 55 includes a resistive element R, capacitive elements C1 and C2, and switch elements SW1 and SW2. The capacitive elements C1 and C2 and the switch elements SW1 and SW2 form a charge share circuit.

The switch element SW1 includes a transfer gate. Specifically, the switch element SW1 includes an N-channel MOS transistor and a P-channel MOS transistor which are coupled to each other in parallel. The activation signal EAMP is inputted to the gate of the N-channel MOS transistor. An inversion signal /EAMP of the activation signal EAMP is inputted to the gate of the P-channel MOS transistor. The switch element SW2 includes an N-channel MOS transistor. The inversion signal /EAMP of the activation signal EAMP is inputted to the gate of the N-channel MOS transistor.

The resistive elements R is provided between the control voltage generation circuit and an output node N1.

The capacitive element C1 is provided between the output node N1 and the power supply voltage VCC.

The capacitive element C2 is coupled between the output node N1 and the power supply voltage VCC through the switch element SW1 in parallel with the capacitive element C1.

The capacitive element C2 is coupled between the power supply voltage VCC and an internal node N2.

The switch element SW1 is provided between the output node N1 and the internal node N2 and is set to a conductive/non-conductive state (ON/OFF) according to the activation signal EAMP.

The switch element SW2 is provided between the internal node N2 and a ground voltage VSS and is set to a conductive/non-conductive state (ON/OFF) according to the inversion signal /EAMP of the activation signal EAMP.

The switch element SW2 operates complementarily with the switch element SW1 according to the inversion signal /EAMP of the activation signal EAMP. When the switch element SW1 is in the conductive state, the switch element SW2 is in the non-conductive state, and when the switch element SW1 is in the non-conductive state, the switch element SW2 is in the conductive state.

In the standby mode, the activation signal EAMP is set to "L" level. In this case, the output of the AMP 50 is set to "H" level, so that the P-channel MOS transistor MOS1 is in a non-conductive state. Accordingly, the current to the resistive elements R1 and R2 is shut down.

The filter circuit with charge share 55 will be described. According to the activation signal EAMP ("L" level), the switch element SW1 becomes the non-conductive state and the switch element SW2 becomes the conductive state. Accordingly, the capacitive element C1 is charged to the power supply voltage VCC.

On the other hand, the switch element SW2 is in the conductive state, so that the capacitive element C2 is coupled to the ground voltage VSS and charged to the ground voltage VSS.

Next, in the read standby mode, the activation signal EAMP is set "H" level. In this case, the AMP 50 is activated and adjusts the voltage outputted to the P-channel MOS transistor MOS1 so that the voltage of the coupling node of the resistive elements R1 and R2 is the same as the reference voltage Vref.

Along with the above, the switch element SW1 becomes the conductive state and the switch element SW2 becomes the non-conductive state according to the activation signal EAMP ("H" level). Thereby, an operation of the charge share circuit is started. The capacitive elements C1 and C2 are coupled, so that the charge of the capacitive element C1 charged to the power supply voltage VCC is shared by and charged to the capacitive element C2 charged to the ground voltage VSS through the switch element SW1.

After the voltage of the output node N1 and the voltage of the internal node N2 become the same, the control voltage outputted from the AMP 50 is adjusted so that the voltage of the coupling node of the resistive elements R1 and R2 becomes the same as the reference voltage Vref and the control voltage is outputted to the electric current source 32 through the output node N1.

Figure 8:
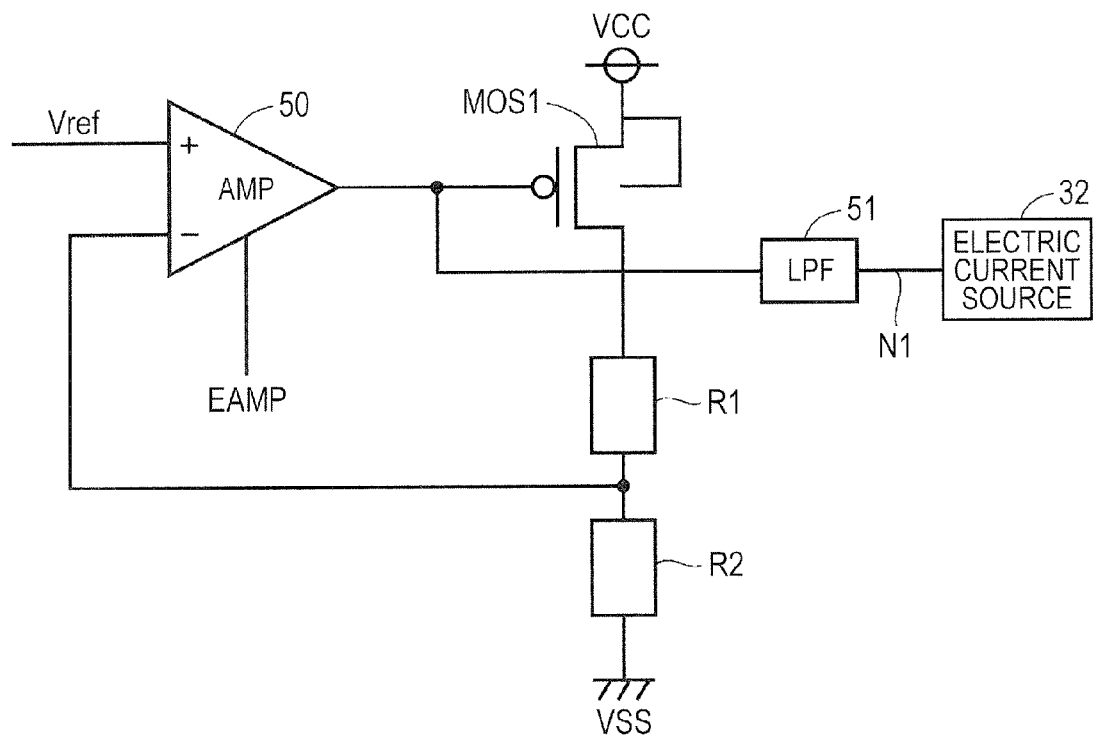
FIG. 8 is a diagram for explaining a part of a configuration of a power supply circuit of a comparative example.

FIG. 8 is a diagram for explaining a part of a configuration of a power supply circuit of a comparative example.

As shown in FIG. 8, a configuration of a filter circuit of the power supply circuit is different from that shown in FIG. 6. In the present example, a case is shown in which a filter circuit 51, which is a normal low pass filter circuit, is provided instead of the filter circuit with charge share 55. The filter circuit 51 does not include a charge share circuit.

Figure 9:
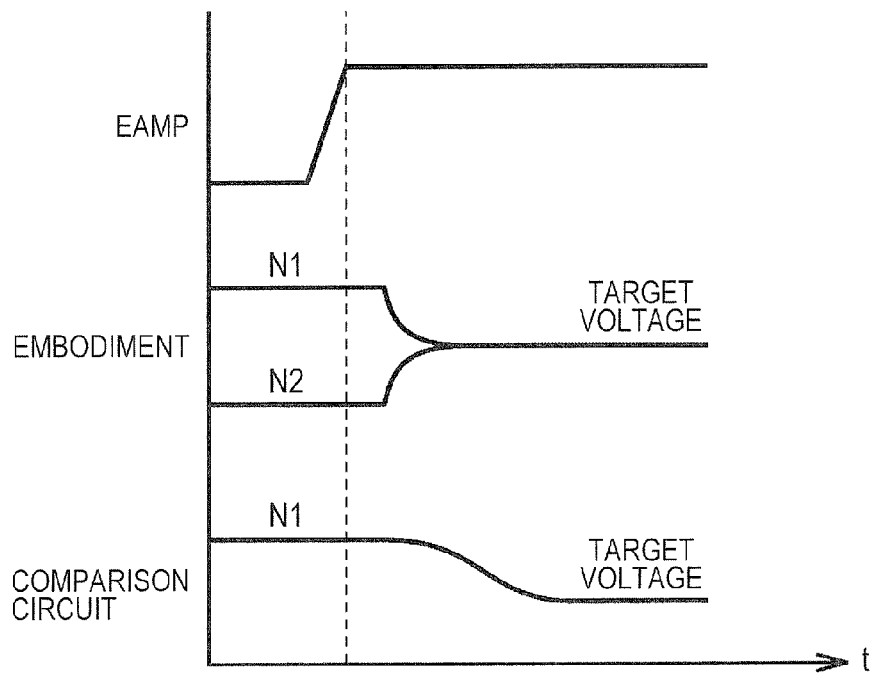
FIG. 9 is a diagram for explaining generation of control voltage of a control voltage generation circuit according to an activation signal AMP based on the embodiment.

FIG. 9 is a diagram for explaining generation of control voltage of a control voltage generation circuit according to the activation signal AMP based on the embodiment.

As shown in FIG. 9, the AMP 50 is activated in response to a rise of the activation signal EAMP from "L" level to "H" level and, at the same time, the charge share circuit starts operation. Accordingly, the output node N1 and the internal node N2 are electrically coupled and are set to an intermediate voltage between the power supply voltage VCC and the ground voltage VSS. After the charge of the capacitive element C1 and the charge of the capacitive element C2 become the same, the control voltage outputted from the AMP 50 is adjusted so that the voltage of the coupling node of the resistive elements R1 and R2 becomes the same as the reference voltage Vref. Then, the control voltage is adjusted to a target voltage.

On the other hand, as shown in FIG. 9, although the AMP 50 is activated in response to a rise of the activation signal EAMP from "L" level to "H" level also in a comparison circuit, the control voltage is gradually adjusted from the power supply voltage VCC to a target voltage by a capacitive component of the filter circuit 51.

Therefore, it is possible to rapidly adjust the control voltage to the target voltage by providing the filter circuit with charge share 55 based on the embodiment. Thereby, it is possible to significantly reduce the wait time tW described in FIG. 4, so that it is possible to rapidly transition the mode from the standby mode to the read standby mode.

Figure 10:
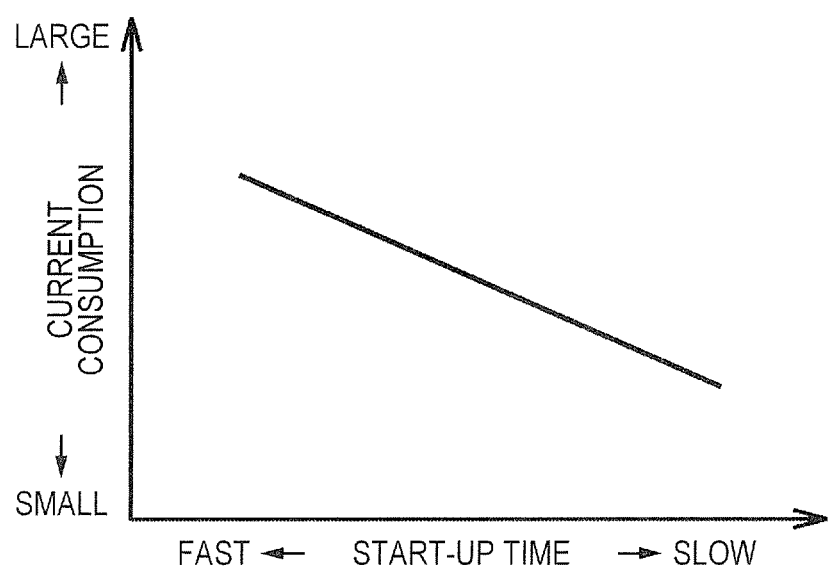
FIG. 10 is a diagram for explaining a relationship between start-up time and current consumption in the power supply circuit 24.

FIG. 10 is a diagram for explaining a relationship between start-up time and current consumption in the power supply circuit 24.

As shown in FIG. 10, as a relationship between the start-up time and the current consumption, it is necessary to increase the current consumption to shorten the start-up time. That is to say, it is necessary to increase an operating voltage of the AMP 50 to increase the current consumption.

The filter circuit with charge share 55 based on the present embodiment adjusts the voltage by movement of charge by the charge share circuit, so that it is possible to rapidly adjust the control voltage to the target voltage without increasing the current consumption.

When the switch SW1 is conductive, the capacitive elements C1 and C2 function as a low pass filter circuit. The cutoff frequency of the filter circuit is set based on the capacitive elements C1 and C2 and the resistive element R1. Therefore, as compared with the filter circuit 51 of the comparison circuit, it is not necessary to provide a redundant capacitive element and only the switch elements SW1 and SW2 are added, so that it is possible to suppress the enlargement of the size of the circuit.

In the present example, the switch element SW1 includes both the P-channel MOS transistor and the N-channel MOS transistor. However, the switch element SW1 may include either one of them.

In the present example, a configuration in which the capacitive elements C1 and C2 are coupled with the power supply voltage VCC is described as a configuration of the low pass filter. However, in the case of a high pass filter circuit or the like, the capacitive elements C1 and C2 may be coupled with the ground voltage VSS.

In the present example, a method is described in which high-speed start-up is possible in the transition from the standby mode to the read standby mode. However, not limited to the above mode transition, for example, the method can also be similarly applied to a case in which the mode transitions from the standby mode to the read mode or the write/erase mode.

In the present example, a configuration of the power supply circuit used by the memory module 8 is described. However, not limited to the memory module 8, the configuration can be similarly applied to a power supply circuit of another semiconductor device.

Although the present disclosure has been specifically described based on the embodiment, the disclosure is not limited to the embodiment and needless to say that the disclosure can be variously modified without departing from the scope of the disclosure.

What is claimed is:

1. A semiconductor device comprising:
an electric current source;
a control voltage generation circuit that outputs a control voltage for controlling the electric current source; and
a filter circuit that is provided between the control voltage generation circuit and the electric current source and removes noise of the control voltage;
wherein the filter circuit includes
a first resistive element that is provided between the control voltage generation circuit and an output node that outputs the control voltage,
a first capacitive element that is provided between the output node and a first voltage,
a second capacitive element that is coupled between the output node and the first voltage in parallel with the first capacitive element, and
a first switch element that is provided between the second capacitive element and the output node,
wherein the second capacitive element is coupled between the first voltage and a second voltage when the first switch element is non-conductive, and
wherein the second capacitive element is coupled with the first capacitive element through the output node when the first switch element is conductive.

2. The semiconductor device according to claim 1,
wherein the filter circuit further includes a second switch element that is provided between an internal node between the second capacitive element and the first switch element and the second voltage and operates complementarily with the first switch element.

3. The semiconductor device according to claim 1,
wherein a cutoff frequency of the filter circuit is set based on a resistive component of the first resistive element and capacitive components of the first and the second capacitive elements when the first switch element is conductive.

4. The semiconductor device according to claim 2,
wherein the control voltage generation circuit includes a transistor whose source is coupled with the first voltage, a second resistive element provided between a drain of the transistor and the second voltage, and
an operational amplifier that outputs the control voltage to a gate of the transistor based on input of a voltage of a coupling node between the transistor and the second resistive element and a reference voltage.

5. The semiconductor device according to claim 4,
wherein the operational amplifier is activated according to an activation signal, and
wherein the first and the second switch elements receive input of the activation signal.

6. The semiconductor device according to claim 2,
wherein each of the first and the second switch elements is formed of a MOS transistor.

7. A semiconductor device comprising:
an electric current source;
a control voltage generation circuit that outputs a control voltage for controlling the electric current source; and
a filter circuit that is provided between the control voltage generation circuit and the electric current source and removes noise of the control voltage,
wherein the filter circuit includes
a resistive element provided between the control voltage generation circuit and an output node that outputs the control voltage,
a first capacitive element that is provided between the output node and a first voltage,
a second capacitive element that is coupled between the output node and the first voltage in parallel with the first capacitive element,
a first switch element that is provided between the second capacitive element and the output node, and
a second switch element that is provided between an internal node between the second capacitive element and the first switch element and the second voltage and operates complementarily with the first switch element.

8. The semiconductor device according to claim 7,
wherein the control voltage generation circuit includes
a transistor whose source is coupled with the first voltage,
a second resistive element provided between a drain of the transistor and the second voltage, and
an operational amplifier that outputs the control voltage to a gate of the transistor based on input of a voltage of a coupling node between the transistor and the second resistive element and a reference voltage.

9. Semiconductor integrated circuit comprising:
a memory module; and
a controller that controls the memory module,
wherein the memory module includes a power supply circuit,
wherein the power supply circuit includes,
a control voltage generation circuit that outputs a control voltage for controlling an electric current source, and
a filter circuit that is provided between the control voltage generation circuit and the electric current source and removes noise of the control voltage,
wherein the filter circuit includes
a first resistive element that is provided between the control voltage generation circuit and an output node that outputs the control voltage,
a first capacitive element that is provided between the output node and a first voltage,
a second capacitive element that is coupled between the output node and the first voltage in parallel with the first capacitive element, and
a first switch element that is provided between the second capacitive element and the output node,
wherein the first switch element is set to a non-conductive state in a low power consumption mode and is set to a conductive state when returning from the low power consumption mode, and
wherein the second capacitive element is coupled between the first voltage and a second voltage in the low power consumption mode and is coupled with the first capacitive element through the output node when returning from the low power consumption mode.

10. Semiconductor integrated circuit according to claim 9,
wherein the controller instructs the memory module to move from the low power consumption mode to a read standby mode.

* * * * *